United States Patent [19]

Uemura

[11] Patent Number: 5,146,464
[45] Date of Patent: Sep. 8, 1992

[54] SEMICONDUCTOR LASER DRIVER CIRCUIT

[75] Inventor: Masaru Uemura, Amagasaki, Japan

[73] Assignee: Mitsubishi Denki Kabushiki Kaisha, Japan

[21] Appl. No.: 651,136

[22] Filed: Feb. 6, 1991

[30] Foreign Application Priority Data

Mar. 31, 1989 [JP] Japan .................................. 1-81864

[51] Int. Cl.$^5$ .............................................. H01S 3/00
[52] U.S. Cl. ........................................ 372/38; 372/31; 372/26
[58] Field of Search ................... 372/26, 28, 31, 25, 372/29, 30, 38

[56] References Cited

U.S. PATENT DOCUMENTS 4,689,795 8/1987 Yoshimoto et al. .................. 372/31

FOREIGN PATENT DOCUMENTS 0009086 2/1984 Japan .

Primary Examiner—Georgia Y. Epps
Attorney, Agent, or Firm—Leydig, Voit & Mayer

[57] ABSTRACT

A semiconductor laser driver circuit has a high frequency current source which superimposes a high frequency current on a dc current so that a semiconductor laser, which oscillates in a single longitudinal mode when driven by the dc current, may oscillate in multiple longitudinal modes. The driver circuit includes a dc current driving level control for automatically adjusting the power output of the semiconductor laser circuitry for determining differential quantization efficiency of the semiconductor laser in reference to the differential quantization efficiency and adjusting the current to achieve a predetermined differential quantization efficiency.

4 Claims, 6 Drawing Sheets

F I G. 5
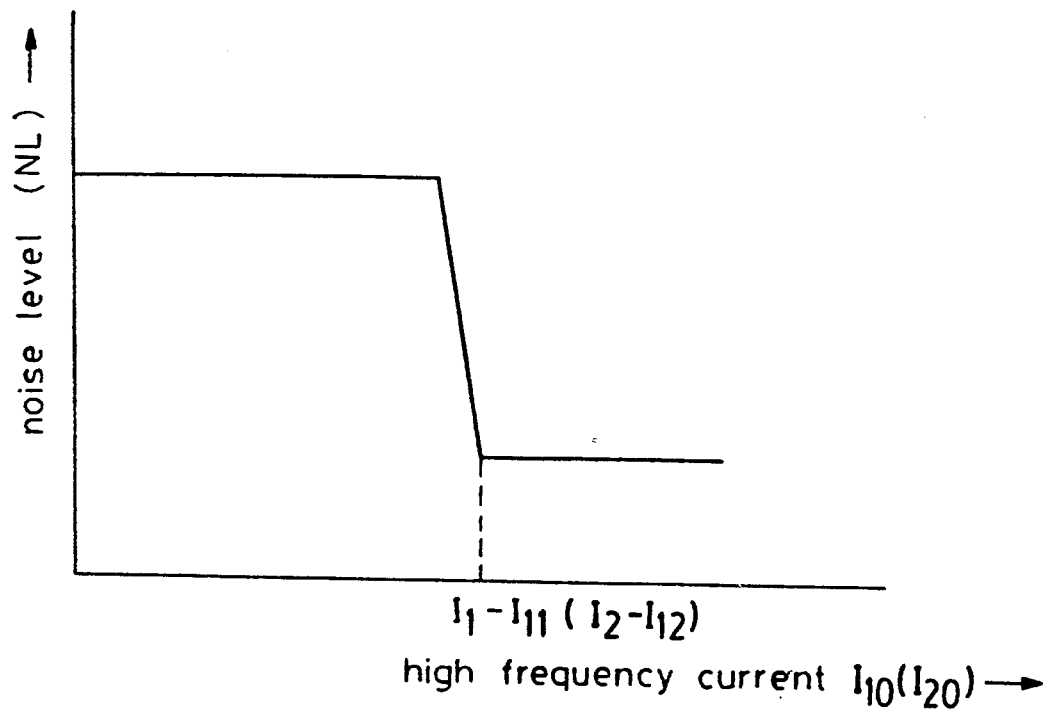

SEMICONDUCTOR LASER DRIVER CIRCUIT

FIELD OF THE INVENTION

The present invention relates to a semiconductor laser driver circuit which drives a light source by superimposing a high frequency current on a dc current.

BACKGROUND OF THE INVENTION

An optical head comprising a semiconductor laser is used as a light source in an optical information recording and reproducing apparatus which records information on and reproduces information from an optical disc. In this case, light from the semiconductor laser is applied to the optical disc. However, when the light from the semiconductor laser is applied to the optical disc, the light is reflected toward the semiconductor laser. Therefore, when the semiconductor laser is driven by a dc current and oscillates in a single longitudinal mode, the quantity of light directed toward the optical disc is a sensitive function of the light reflected from the optical disc as shown in Japanese Patent Laid-Open Publication No. Sho. 59-9086. As a result, the signal which is obtained by reproducing the recorded information includes noise from the light reflected from the optical disc. In order to reduce such noise generated by the laser light returning to the semiconductor laser, a high frequency current is superimposed on the dc current which drives the semiconductor laser.

FIG. 3 is a block diagram showing a semiconductor laser driver circuit producing a driving current in which a high frequency current is superimposed on a dc current. An output of a high frequency power supply 10 is applied to the anode of a semiconductor laser 1 through a coupling capacitor C and the cathode of the semiconductor laser 1 is grounded through a resistor R. Light emitted from the semiconductor laser 1 is applied to an optical disc 4, through which information is recorded or reproduced, through a collimator lens 2 and a condenser lens 3. In addition, the light emitted from the semiconductor laser 1 is received and converted to a signal by a photo detector 5. The signal is input to a current-voltage conversion amplifier 6 and the output thereof is input to a buffer amplifier, 7. The output of the buffer amplifier 7 is connected to the cathode of a diode 8a of a minimum signal detecting circuit 8 and the anode of the diode 8a is connected to an input terminal 9a of a differential amplifier 9. A reference voltage $+V_B$ is applied to the anode of the diode 8a through a resistor 8b and a capacitor 8c connected in parallel. A reference voltage $+V_R$ is applied to another input terminal 9b of the differential amplifier 9. An output terminal 9c of the differential amplifier 9 is connected to the anode of a diode 11a of a clamping circuit 11 and the cathode of the diode 11a is connected to a driver circuit 12 having a dc power supply therein. In addition, an output of the pulse generator 13 is applied to the cathode of the diode 11a through a a resistor 11b and a capacitor 11c connected in parallel the clamping circuit 11. The output of a driver circuit 12 is applied to the anode of the semiconductor laser 1 through a low-pass filter F.

The operation of the semiconductor laser driver circuit will be described in detail hereinafter.

When a dc current is applied from the driver circuit 12 through the filter F and a high frequency current is applied from the high frequency power supply 10 through the capacitor C to the semiconductor laser 1, the high frequency current is superimposed on the dc current, whereby the semiconductor laser 1 is driven and emits light. The light from the semiconductor laser 1 is applied to the optical disc 4 through the collimator lens 2 and the condenser lens 3, thereby recording information on or reproducing information from the optical disk.

FIG. 4 is a graph showing differential quantization efficiency $\eta$ by showing the relation between driving current I and laser output P of the semiconductor laser 1. More specifically, the differential quantization efficiency $\eta$ of the semiconductor laser A is different from that of the semiconductor laser B. In addition, the differential quantization efficiency $\eta$ varies with ambient temperature. For example, when the ambient temperature is increased, the slope of the line showing the differential quantization efficiency $\eta$ of the semiconductor laser A is decreased as shown by a dashed line X. Therefore, when the same driving current flows, the output level of the laser light is reduced from $L_1$ to $L_2$.

A description will be given of dc current driving level setting means for automatically setting a power level of the semiconductor laser. FIG. 6 shows signal waveforms at each node $n_1$ to $n_6$ of the dc current driving level setting means. The pulse generator 13 receives a sector detecting signal $S_D$ which is obtained by detecting the start of each sector (not shown) of the optical disc for recording and reproducing information and a test pulse $T_P$ is generated at the head position of each sector using the sector detecting signal $S_P$ as a reference. In addition, a gate signal $S_G$ is applied from the pulse generator 13 to the gate circuit 14 so that while the test pulse $T_P$ is applied, the high frequency current is not applied to the semiconductor laser 1. On the other hand, the square-wave test pulse $T_P$ for setting the power level of the semiconductor laser 1 is applied from the pulse generator 13 to the clamping circuit 11 and then applied to the driver circuit 12 through the parallel circuit of the resistor 11b and the capacitor 11c of the clamping circuit 11.

The light emitted from the semiconductor laser 1 driven by the driver circuit 12 is received by the photodetector 5 and is converted to a signal that is input to the current-voltage conversion amplifier 6. The currentvoltage conversion amplifier 6 amplifies the voltage converted from the current detected by the photo detector 5 and its output is further amplified by the buffer amplifier 7. Then, it (the signal having an upper peak, i.e., maximum, value $V_2$ and a bottom peak, i.e., maximum, value $V_1$ as shown in FIG. 6) is input to the minimum detecting circuit 8. A capacitor 8c holds the voltage difference $V_B - V_1$ and the minimum detecting circuit 8 detects the bottom peak value $V_1$ of an output voltage of the buffer amplifier 7 in response to the squarewave test pulse $T_P$. The detected peak value signal is input to the input terminal 9a of the differential amplifier 9. The differential amplifier 9 compares the bottom peak value voltage with the reference voltage $V_R$ and then amplifies the difference between them and the amplified output $V_C$ shown in FIG. 6 is input to the clamping circuit 11. The capacitor 11c is charged by the difference voltage between the minimum voltage of the test pulse $T_P$ having an upper peak value $V_{II}$ and a bottom peak value $V_I$ input from the pulse generator 13 and the output voltage of the differential amplifier 9 in the clamping circuit 11. Then, the bottom of the test pulse $T_P$ is clamped to a voltage at which the laser power predetermined by the reference voltage $V_R$ of the differential amplifier 9 is obtained as shown in FIG. 6. Thus the power of the semiconductor laser 1 is automatically set at a predetermined level.

As described above, the semiconductor laser is driven by a current in which a high frequency current is superimposed on a dc current and oscillates in multiplied longitudinal modes, so that generation of noise caused by the light reflected from the optical disc can be prevented.

Meanwhile, as described above, the differential quantization efficiency of the semiconductor laser 1 varies with each semiconductor laser and the ambient temperature.

When the semiconductor laser A is driven, the dc current is set at $I_1$ and a driving current I comprising a high frequency current $I_{10}$ superimposed on the dc current $I_1$ is applied. When the semiconductor laser B is driven, the dc current is set at $I_2$ which is larger than the dc current $I_1$ and the driving current I comprising a high frequency current $I_{20}$ which is larger than the high frequency current $I_{10}$ superimposed on the dc current $I_2$ is applied. As a result, the same laser power output level is obtained from both semiconductor lasers A and B.

FIG. 5 is a graph showing the relation between the level of noise generated by a change of light quantity reflected from the optical disc toward the semiconductor laser and a high frequency current superimposed on a dc current. As can be seen from FIG. 5, when the high frequency current $I_{10}$ (or $I_{20}$) reaches a value so that the difference between the dc current $I_1$ (or $I_2$) and a driving current $I_{11}$ (or $I_{12}$) of the (or $I_2$) and a driving current $I_{11}$ (or $I_{12}$) of the semiconductor laser A (or B) when the laser output power P is zero, the noise level NL is suddenly decreased. Even if the high frequency current $I_{10}$ is further increased, the noise level NL is not changed. However, if the high frequency current is increased beyond necessity unnecessary electromagnetic wave energy is radiated, adversely affecting the peripheral circuits. On the other hand, if the high frequency current $I_{10}$ is decreased beyond necessity, the effect to be achieved by superimposing the high frequency current on the dc current is not obtained.

As described above, when the high frequency current is set at a difference value between the dc current $I_1$ (or $I_2$) and the driving current $I_{11}$ (or $I_{12}$) when the laser output P is zero, the level of noise caused by reflected light can be minimized and also the semiconductor laser can be driven with maximum efficiency. However, since differential quantization efficiency varies with each semiconductor laser and ambient temperature, the high frequency current can not be always applied to the semiconductor laser appropriately.

SUMMARY OF THE INVENTION

The present invention was made to solve those problems and it is an object of the present invention to provide a semiconductor laser driver circuit in which the noise level is controlled to be as low as possible and also the high frequency current of a semiconductor laser is appropriately controlled even if the differential quantization efficiency varies with each semiconductor laser and ambient temperature.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

A semiconductor laser driver circuit in accordance with the present invention comprises mean for determining the differential quantization efficiency of a semiconductor laser to control the high frequency input for driving the semiconductor laser in response to the determined differential quantization efficiency.

The semiconductor laser is driven by a driving current in which a high frequency current is superimposed on a dc current. Then, the differential quantization efficiency of the semiconductor laser is determined by means for determining the differential quantization efficiency. The high frequency input of the semiconductor laser driver circuit is controlled in response to the determined differential quantization efficiency.

As a result, the high frequency input of the semiconductor laser driver circuit is appropriate for the semiconductor laser and also for ambient temperature.

BRIEF DESCRIPTION OF THE DRAWINGS

FIG. 5 is a graph showing the relation between a high frequency current superimposed on a dc current and noise level.

DETAILED DESCRIPTION OF THE PREFERRED EMBODIMENT

An embodiment of the present invention will be described in detail hereinafter in reference to the drawings.

Figure 1:
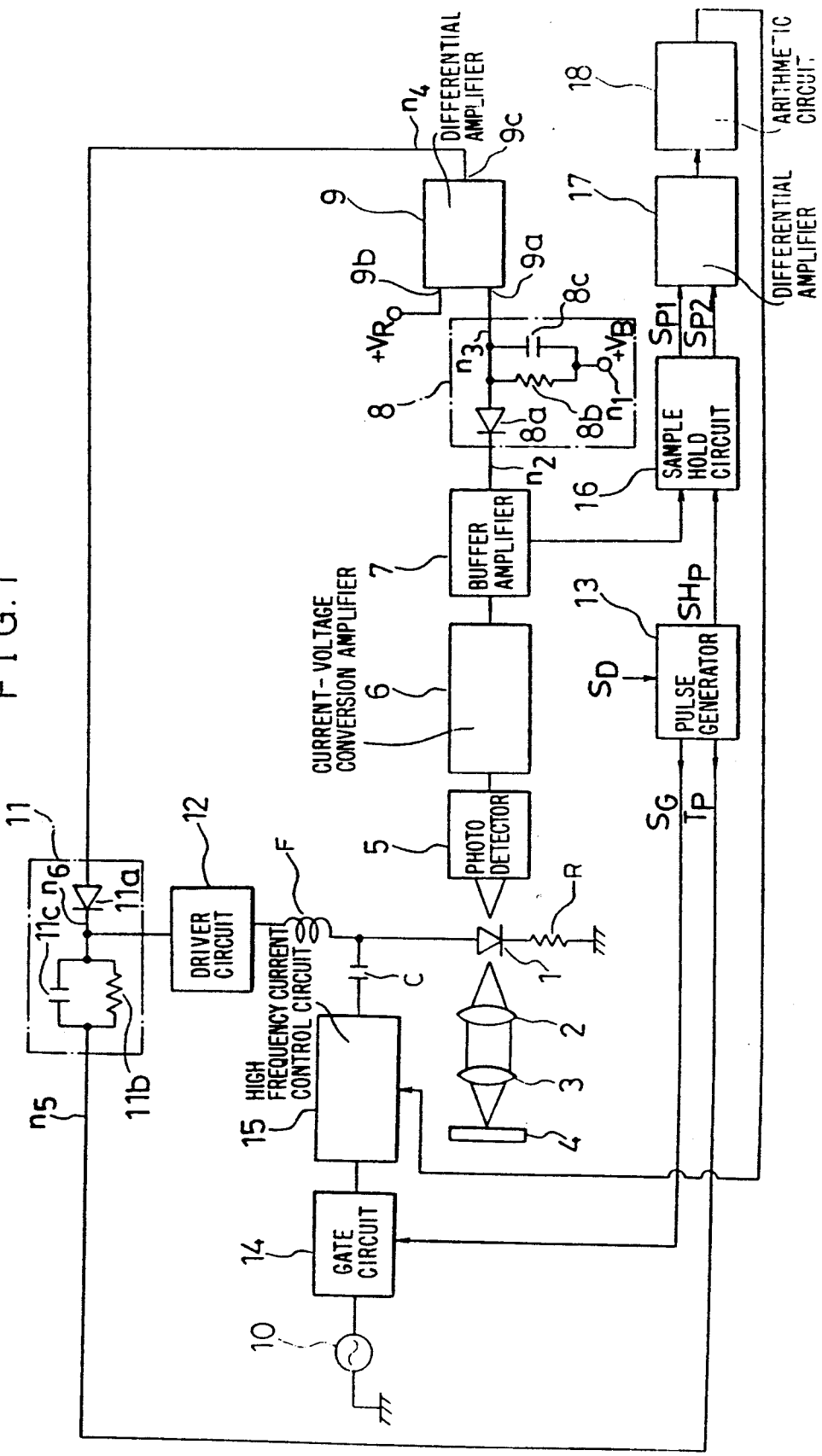
FIG. 1 is a block diagram, showing a semiconductor laser driver circuit in accordance with the present invention.

FIG. 1 is a block diagram showing a semiconductor laser driver circuit in accordance with the present invention. A high frequency current from a high frequency power supply 10 is applied to a high frequency current control circuit 15 through a gate circuit 14. The output thereof is applied to the anode of a semiconductor laser 1 through a coupling capacitor C. The cathode of the semiconductor laser 1 is grounded through a resistor R. An optical disc 4 is irradiated with light from the semiconductor laser 1 through a collimator lens 2 and a condenser lens 3. A photo detector 5 is also irradiated with light from the semiconductor laser 1 and the output thereof is input to a currentvoltage conversion amplifier 6. The output of the currentvoltage conversion amplifier 6 is input to a buffer amplifier 7. An output of the buffer amplifier 7 is connected to the cathode of a diode 8a of a minimum detecting circuit 8 and the anode of the diode 8a is connected to an input terminal 9a of a differential amplifier 9. The anode of the diode 8a is connected to a dc power supply which outputs a reference voltage $+V_B$ through a resistor 8b and a capacitor 8c connected in parallel. A reference voltage $+V_R$ is applied to an input terminal 9b of the differential amplifier 9. The output terminal 9c of the differential amplifier 9 is connected to the anode of a diode 11a of a clamping circuit 11 and the cathode of the diode 11a is connected to a driver circuit 12. The output of the driver circuit 12 is applied to the anode of the semiconductor laser 1 through a filter F which stops the high frequency superimposed current.

A pulse generator 13 generating a square wave test pulse of receives a sector detecting signal $S_D$ which is obtained by detecting the start of each sector (not shown) of an optical disc on which information is recorded or from which information is reproduced and a test pulse $T_P$ is generated at the head of each sector using the sector detecting signal $S_D$ as a reference. In addition, a gate signal $S_G$ is applied from the pulse generator 13 to the gate circuit 14 and when the test pulse $T_P$ is applied, the high frequency current is not applied to the semiconductor laser. On the other hand, a square wave test pulse $T_P$, through which the power output of the semiconductor laser 1 is set and the differential quantization efficiency of the semiconductor laser 1 is determined, is applied from the pulse generator 13 to the clamping circuit 11 and then to the driver circuit 12 through the resistor 11a and the capacitor 11b, connected in parallel, of the clamping circuit 11. A sample hold pulse $SH_P$ which is synchronized with the test pulse $T_P$ from the pulse generator 13 and has a frequency twice that of the test pulse $T_P$ is input to one terminal of a sample hold circuit 16 which samples the peak value, and an output voltage of the buffer amplifier 7 is input to another terminal of the sample hold circuit 16. Outputs $S_{P1}$ and $S_{P2}$ obtained by sampling the minimum and maximum values of the voltage, respectively, from the buffer amplifier 7 in response to the test pulse $T_P$ are both input from the sample hold circuit 16 to a differential amplifier 17. The output of the differential amplifier 17 is input to an arithmetic circuit 18, and the output of the arithmetic circuit 18 is input to the high frequency current control circuit 15. The differential quantization efficiency $\eta$ (i.e., the slope of the power output-driving current line) of each semiconductor laser is stored in the arithmetic circuit 18 and then the arithmetic circuit 18 calculates a driving current in accordance with the differential quantization efficiency. An output in accordance with the driving current, which was calculated by the arithmetic circuit 18, is applied to the high frequency current control circuit 15.

Operation of the-thus constructed semiconductor laser driver circuit will be described in reference to FIG. 2.

Figure 2:
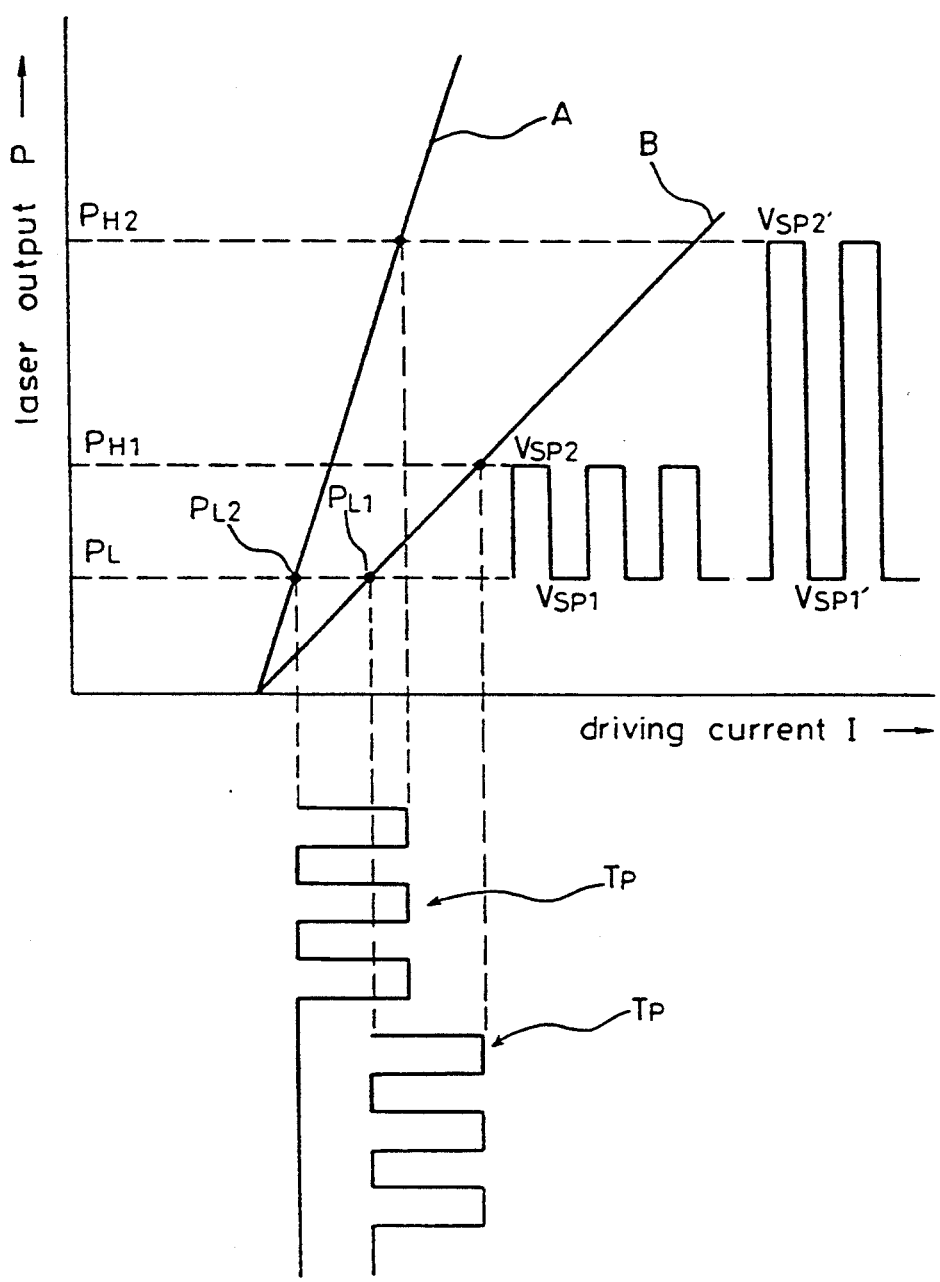
FIG. 2 is a graph showing the relation between a driving current of the semiconductor laser, laser power output and a test pulse.
Figure 3:
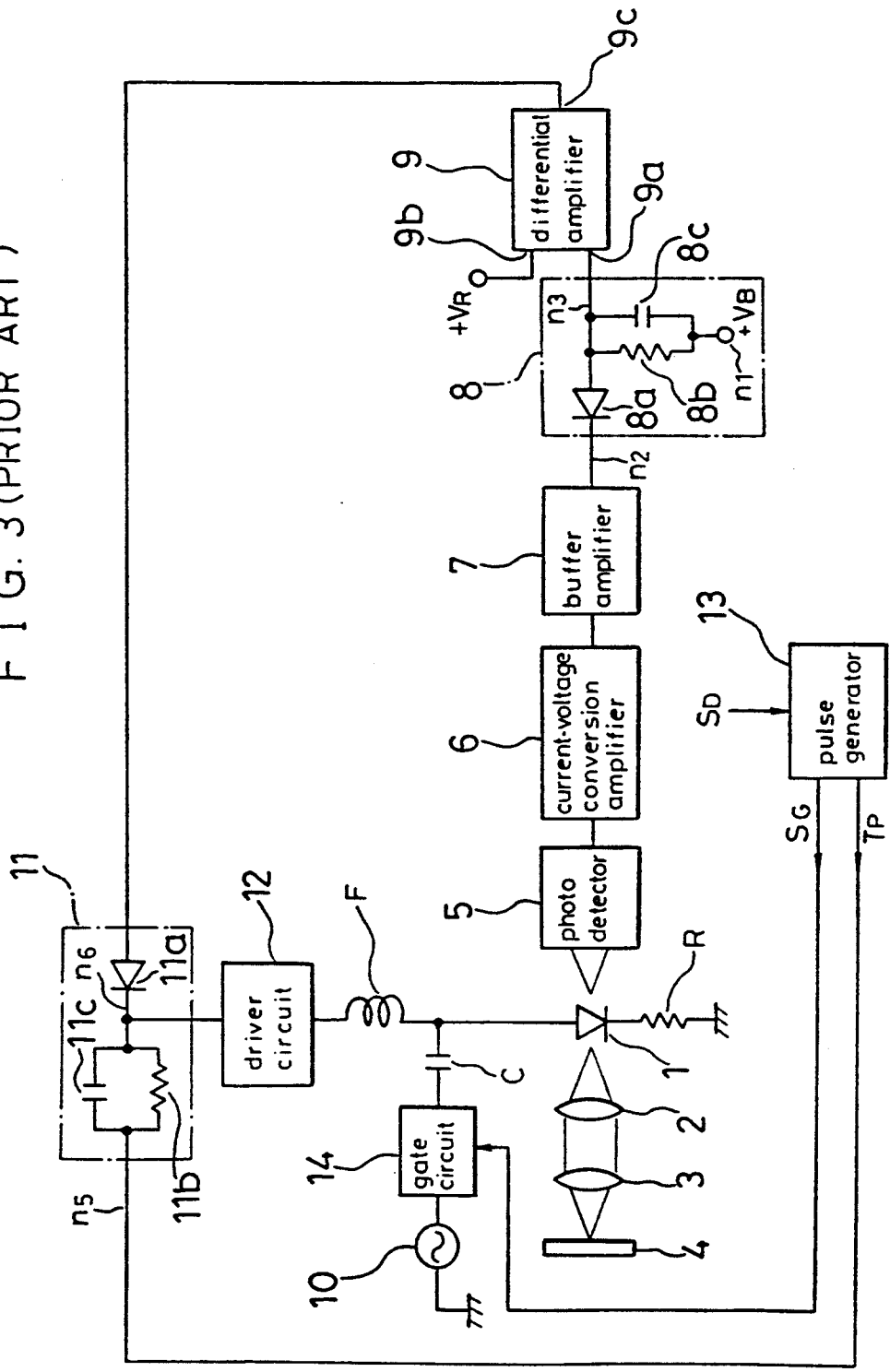
FIG. 3 a block diagram showing a conventional semiconductor laser driver circuit.
Figure 4:
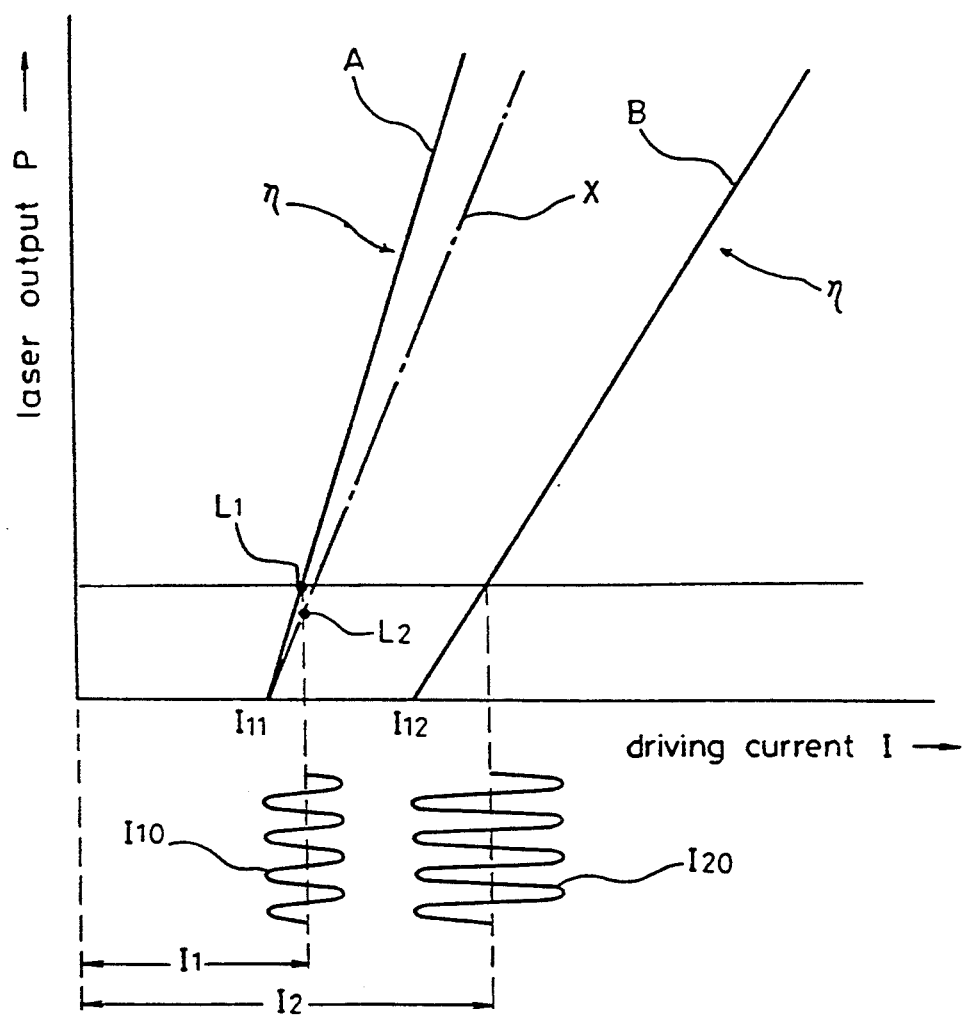
FIG. 4 is a graph showing the relation between the driving current of a semiconductor laser power and the laser output.
Figure 6:
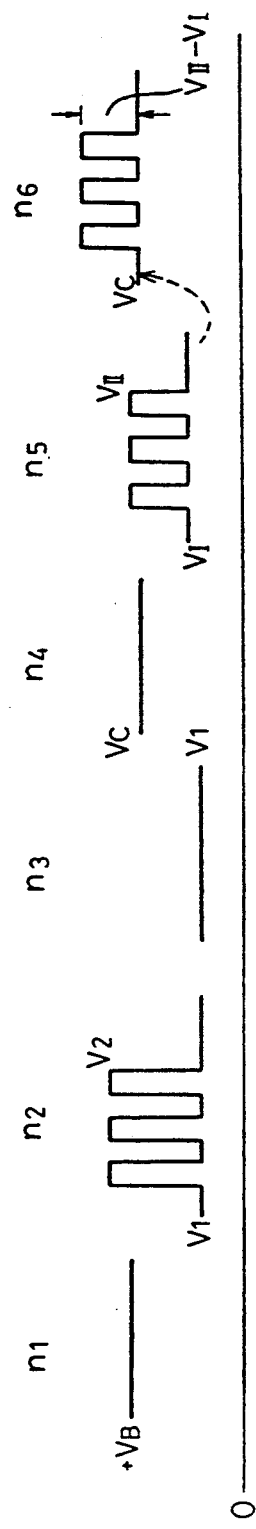
FIG. 6 is a waveform diagram for explaining the dc current driving level setting operation.

FIG. 2 is a graph showing the relation between the differential quantization efficiency and the test pulse, in which power output P of the semiconductor laser is shown on the vertical axis and the driving current of the semiconductor laser is shown on the horizontal axis. A dc current flows from the dc power supply (not shown) in the driver circuit 12 to the semiconductor laser 1 through the filter F. The test pulse $T_P$ and the gate signal $S_G$ are applied to the clamping circuit 11 and the gate circuit 14, respectively, from the pulse generator 13. Thus, the gate circuit 14 is open while the test pulse $T_P$ is applied so that the high frequency current is prevented from flowing from the high frequency power supply 10 into the semiconductor laser 1 through the gate circuit 14, the high frequency current control circuit 15 and the coupling capacitor C. As a result, the semiconductor laser 1 is driven by the test pulse $T_p$ and emits light. The light from the semiconductor laser 1 is applied to the optical disc 4 through the collimator lens 2 and the condenser lens 3. In addition, the light from the semiconductor laser 1 is applied to the photo detector 5 and is to an electrical signal therein. Then, the output from the photo detector 5 is input to the current-voltage conversion amplifier 6. The current-voltage conversion amplifier 6 converts the current to a voltage and then amplifies it. The voltage signal is further amplified by the buffer amplifier 7 and then input to the sample hold circuit 16. The output from the buffer amplifier 7 is applied to the diode 8a of the minimum detecting circuit 8 and when the bottom voltage of the output voltage of the buffer amplifier 7 corresponding to the test pulse $T_p$ becomes lower than a reference voltage $+V_B$, a charging current flows into the capacitor 8c and then the capacitor 8c is charged. Then, a voltage corresponding to a bottom peak value $P_{L1}$ or $P_{L2}$ of the test pulse $T_P$ is detected, and its potential is applied to the input terminal 9a of the differential amplifier 9. Then, the differential amplifier 9 differentially amplifies the reference voltage $+V_R$ and the voltage applied to the input terminal 9a of the differential amplifier 9 and its output is applied to the clamping circuit 11. the test pulse $T_p$ output from the pulse generator 13 is also applied to the clamping circuit 11 and the capacitor 11c is charged by the difference between the output voltage of the differential amplifier 9 and the minimum voltage of the test pulse $T_p$. As a result, the minimum voltage of the test pulse $T_p$ is clamped to the output voltage level of the differential amplifier 9. The clamped voltage is held for a predetermined time and the dc current to be supplied to the semiconductor laser 1 by the driver circuit 12 is controlled and automatically set at laser power $P_L$ predetermined by the reference voltage $V_R$ of the differential amplifier 9.

On the other hand, the sample hold pulse $SH_P$ is applied from the pulse generator 13 to the sample hold circuit 16. The electrical signal produced by photodetector 5 from the light output from the semiconductor laser 1 driven by the test pulse $T_P$ is applied from the buffer amplifier 7 to the sample hold circuit 16. The sample hold circuit 16 samples an upper peak value $V_{SP2}$ ($V_{SP2'}$) and a bottom peak value $V_{SP1}$ ($V_{SP1'}$) of the output voltage corresponding to the laser output level $P_{H1}$ ($P_{H2}$) and $P_{L1}$ ($P_{L2}$), respectively in response to the test pulse $T_P$ and then outputs them. The output signals $V_{SP1}$ ($V_{SP1'}$) and $V_{SP2}$ ($V_{SP2'}$) are differentially amplified by the differential amplifier 17 and its amplified output is input to the arithmetic circuit 18. The arithmetic circuit 18 finds the inclination of differential quantization efficiency $\eta$ of the semiconductor laser 1 in accordance with the difference between the minimum value and the maximum value of the output voltage of the buffer amplifier 7 in response to the input test pulse $T_P$, that is , in accordance with the difference between the outputs P of the semiconductor laser A and the semiconductor laser B. The laser output P of the semiconductor laser A corresponds to $P_{H2}$ and $P_L$, while the laser output P of the semiconductor laser B corresponds to $P_{H1}$ and $P_L$ in response to the same test pulse $T_P$ as shown in FIG. 2. Then, the output signal related to the obtained differential quantization efficiency $\eta$ is applied to the high frequency current control circuit 15. Thus, when the slope of the differential quantization efficiency $\eta$ is smaller than a predetermined slope, the high frequency current control circuit 15 increases the high frequency current and when the slope is larger than the predetermined slope, circuit 15 decreases the high frequency current. As a result, the high frequency current flowing into the semiconductor laser 1 is varied in accordance with the differential quantization efficiency $\eta$ of the semiconductor laser 1. Therefore, when the differential quantization efficiency $\eta$ of the semiconductor laser 1 varies from laser-to-laser and when it varies with ambient temperature, the high frequency current can be adjusted in accordance with those variations, so that the high frequency current does not become too large nor too small. As a result, it is possible to prevent noise generated by a change of light output which is caused by reflected light and to prevent unnecessary electromagnetic wave radiation caused by too much high frequency current.

Since the semiconductor laser 1 oscillates in multiple longitudinal modes driven by a current in which an appropriate high frequency current controlled as above is superimposed on a dc current, there is no influence by change of light output quantity of the semiconductor laser caused by reflected light from the optical disc toward the semiconductor laser. Thus it is possible to prevent noise caused by such reflected light.

As described above, according to the present invention, even if the differential quantization efficiency varies with an individual semiconductor laser or with ambient temperature, an appropriate high frequency current can always flow into the semiconductor laser. As a result, it is possible to prevent noise caused by reflected light directed toward the semiconductor laser which is driven by a current in which a high frequency current is superimposed on a dc current and to prevent also unnecessary electromagnetic wave radiation caused by too much high frequency current. Furthermore, the effect achieved by superimposing the high frequency current is not damaged.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser driver circuit comprising:
   means for generating a direct current of variable magnitude for driving a semiconductor laser having a variable differential quantization efficiency and producing variable power laser light in response to the magnitude of the direct current;
   means for generating a high frequency current of variable magnitude for superposition on the direct current for driving the semiconductor laser;
   means for controlling the magnitude of the direct current in response to the power of the laser light produced by the semiconductor laser in response to the direct current and superposed high frequency current;
   means for determining the differential quantization efficiency of the semiconductor laser driven by the direct current and superposed high frequency current; and
   means for controlling the magnitude of the high frequency current in response to the differential quantization efficiency of the semiconductor laser driven by the direct current and superposed high frequency current whereby variations in operation of the semiconductor laser in response to reflected laser light incident on the laser are reduced.

2. The semiconductor laser driver circuit as defined in claim 1 wherein the means for controlling the magnitude of the direct current comprises:
   a gate circuit for connecting and disconnecting the means for generating a high frequency current and the semiconductor laser;
   a clamping circuit for passing the direct current from the means for generating a direct current to the semiconductor laser;
   a pulse generator for generating a gate signal applied to said gate circuit to prevent the high frequency current from reaching the semiconductor laser when a test pulse is applied to the semiconductor laser and for generating a test pulse having a maximum and minimum voltage supplied to the clamping circuit to clamp a minimum voltage of the test pulse;
   a photodetector receiving light generated by the semiconductor laser for generating a current signal in response to the received light; 'a currentvoltage conversion amplifier for converting the current signal into a voltage signal;
   a buffer amplifier for amplifying the voltage signal and producing an amplified voltage signal as an output signal;
   a minimum detecting circuit for detecting a minimum voltage of the output signal; and
   a first differential amplifier for amplifying the difference between the minimum voltage of the output signal and a reference voltage wherein said clamping circuit clamps the minimum voltage of the test pulse to an output voltage level of said differential amplifier and thereby controls the magnitude of the direct current.

3. A semiconductor laser driver circuit as defined in claim 2 wherein means for determining differential quantization efficiency of the semiconductor laser comprises:
   a sample hold circuit for sampling and outputting a maximum value and a minimum value of the voltage signal when the semiconductor laser is driven by a test pulse;
   a second differential amplifier for differentially amplifying maximum and minimum values from said sample hold circuit; and
   an arithmetic circuit connected to said second differential amplifier for calculating the differential quantization efficiency of the semiconductor laser from the difference between the maximum value and the minimum value.

4. A semiconductor laser driver circuit as defined in claim 1 wherein the means for controlling the magnitude of the high frequency current in response to the differential quantization efficiency controls the magnitude of the high frequency current to produce a predetermined differential quantization efficiency.

* * * * *